United States Patent [19]
Watanabe et al.

[11] 3,947,822
[45] Mar. 30, 1976

[54] PROCESSOR OF MICRO-COMPUTER WITH DIVISION OF MICRO-INSTRUCTION

[75] Inventors: Kazuo Watanabe, Kokubunji; Nobuo Hamamoto, Hachioji, both of Japan

[73] Assignee: Hitachi, Ltd., Japan

[22] Filed: Mar. 18, 1974

[21] Appl. No.: 452,272

[30] Foreign Application Priority Data
Mar. 16, 1973 Japan................. 48-30099

[52] U.S. Cl. ............................... 340/172.5
[51] Int. Cl.² ............................. G06F 9/16
[58] Field of Search ............ 340/172.5; 445/1

[56] References Cited
UNITED STATES PATENTS

| | | | |
|---|---|---|---|
| 3,462,742 | 8/1969 | Müller et al. | 340/172.5 |
| 3,665,411 | 5/1972 | O'Connor | 340/172.5 |
| 3,760,369 | 9/1973 | Kemp | 340/172.5 |
| 3,786,434 | 1/1974 | Frye et al. | 340/172.5 |
| 3,806,880 | 4/1974 | Spence | 340/172.5 |
| 3,821,715 | 6/1974 | Hoff, Jr. et al. | 340/172.5 |
| 3,832,694 | 8/1974 | Judith | 340/172.5 |
| 3,839,705 | 10/1974 | Davis et al. | 340/172.5 |

*Primary Examiner*—Gareth D. Shaw
*Assistant Examiner*—John P. Vandenburg
*Attorney, Agent, or Firm*—Craig & Antonelli

[57] ABSTRACT

An operation control system for a micro-computer comprises a control unit and a register unit. A micro instruction stored in a read only memory of the control unit is fetched, a one word instruction is divided into six time stages and the divided instructions are transmitted to the register unit in a time-multiplexed format with each stage being a fundamental time unit, while the register unit decodes the micro instructions of the fundamental units fed thereto and executes the micro instructions of the fundamental units in a manner to overlap in time.

10 Claims, 17 Drawing Figures

PROCESSOR OF MICRO-COMPUTER WITH DIVISION OF MICRO-INSTRUCTION

BACKGROUND OF THE INVENTION

1. Field of the Invention:

The present invention relates to the operation control system of an electronic computer and, more particularly to the operation control system of a micro-computer.

2. Description of the Prior Art:

Advances in semiconductor integration technology have had a great impact on the field of electronic computers. One of these impacts is the large scale integration (LSI) of the logic elements constituting an electronic computer. Rapid strides in performance have been proven by a number of electronic computers already developed. Another impact is the LSI of the electronic computer itself. This measure has attracted attention as a chief section of future electronic computers conjointly with the development of new fields of application.

Since with a micro-computer, an operation control unit is integrated into one to several packages, the overall construction of the system requires various forms. More specifically, the micro-computer formed by LSI techniques is naturally restricted by the chip size (the degree of integration), the package size (the number of terminals), operating speed and power dissipations of elements, etc. It is, therefore, necessary to develop an overall system layout which solves these restrictions. Further in forming the system, it must be carefully considered that satisfactory function inspections be made with a limited number of terminals.

When the chip size of the LSI circuit is large, the yield of the product becomes inferior, and the cost becomes high. The chip size should accordingly, be fit for present integration techniques by taking the optimum degree of integration into consideration. Since the chip size and, accordingly, the degree of integration, is restricted in this manner, it is often difficult to form the operation control unit of the micro-computer in a single chip.

In order to solve this problem, the operation control unit may be divided and formed in a plurality of chips. In this case, the manner in which the operation control unit is divided must be considered in association with the number of package terminals. The number of package terminals is limited, and yet, terminals for supplying signals from and delivering signals to external input and output equipment, a main memory, etc., terminals for various control signals and timing signals, power supply terminals, and so forth, are indispensible. Delivery and reception of signals between the respective chips must, therefore, be effected with the remaining terminals.

The performance of the micro-computer is restricted by the operating speeds of the constituent elements. The operating speed is determined in association with the power dissipation in dependence on the speed-power product of the element for use. That is, the upper limit of the number of gates to be integrated is determined by the operating speed and the allowable power loss which is determined by the heat radiating capacity of the package for use. Consequently, for enhancing performance, the micro-computer must employ a logic construction in which the number of gates is minimized.

To be further considered in determining the overall layout of the micro-computer is that the logic construction must be employed with which satisfactory function tests can be executed among the limited number of terminals and which facilitates the tests in the system construction.

SUMMARY OF THE INVENTION:

An object of the present invention is to provide an operation control system for a micro-computer which solves the foregoing problems and which is suitable for large scale integration.

In order to accomplish this object, a micro instruction is divided into a plurality of control units, the control unit is the fundamental unit of control processing, and operations corresponding to the respective instructions of the control units are executed in a manner to overlap in time. Further, the instructions of the control units are transmitted from a control unit to an operation unit of the micro-computer in the control units and in a time-sharing manner. Thus, the number of terminals in the LSI can be sharply reduced, and the fetch cycle of the micro instruction can have an effective high speed.

Other objects and features of the present invention will become apparent from the following detailed description when read in conjunction with the accompanying drawings.

Figure 1:
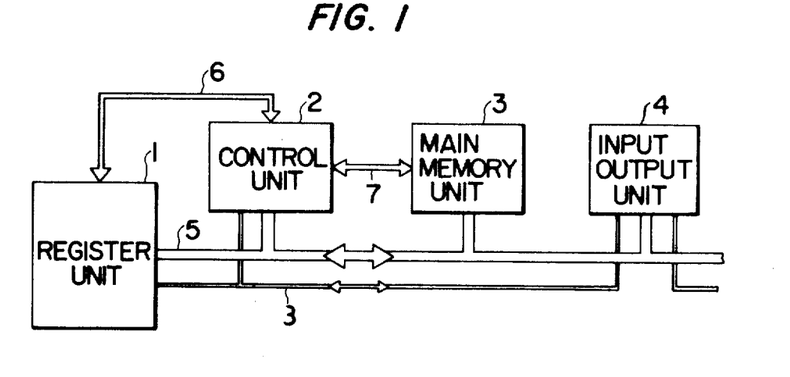
FIG. 1 is a constructional diagram of the overall micro-computer according to the present invention.

PREFERRED EMBODIMENTS OF THE INVENTION:

Referring to FIG. 1, the basic processor unit of a micro-computer is composed of two LSI chips. One of them is a register unit 1 which consists of an operation circuit and registers for various operations. The other is a control unit 2 which consists of a read only memory for storing a micro program, a circuit for controlling the read only memory, and a circuit for decoding an instruction.

To the two units 1 and 2 at the center, a main memory unit 3, and an input output control unit, including an interface, 4 are connected. Thus, a complete microcomputer system is formed.

The units 1, 2, 3, and 4 are commonly coupled by a bidirectional data bus line 5, which is used for the transmission of a memory address and read or write data between the register unit 1 and the main memory unit 3, for the transmission of an instruction word read out from the main memory 3 between the control unit 2 and the main memory unit 3, and for the transmission of a device address and input or output data between the register unit 1 and the input output unit 4.

Between the register unit 1 and the control unit 2, there is a control bus 6. It is used in order to transmit to the register unit 1 control information read out signals from the read only memory in the control unit 2, and to send back to the control unit 2 the result of the judgement of condition which the register unit 1 has made on a certain test, for example, on the sign, carry or overflow for an operated result by the use of control information.

In addition, there are a memory control bus 7 coupling the control unit 2 to the main memory 3, and an I/O control bus 8 coupling the register unit 1 to the control unit 2 and to the input output unit 4. The memory control bus 7 is used for the starting of a read or write operation of the main memory 3 and for the transmission of interface signals, such as a signal for confirming the delivery of a read data and signal for reporting the completion of a cycle. The I/O control bus 8 is used for the transmission of confirmation signals necessary for the exchange of data between the input output unit 4 and the other units and the transmission of interrupt control information.

The basic processor unit of the micro-computer is divided as shown in FIG. 1 into the two LSI chips of the operation portion or register unit 1 and the control portion or control unit 2, and the micro program system is adopted as the control system. This is for attaining effective solutions to the many problems attendant upon large scale integration of the computer. That is:

1. By the division of the basic processor unit into the two chips, it becomes possible to decrease the number of integrated gates per chip, which is advantageous for reducing the chip size (rendering the cost low) and diminishing the power dissipation (rendering the speed high).

2. Owing to the micro program control, it becomes possible to introduce a diagnostic system of high quality (micro diagnosis).

3. Since the basic processor unit is divided by the operation portion and the control portion, a high degree of freedom is obtained for transferring information in and out for the diagnosis of trouble.

On the other hand, the division into the chips results in an increase of the number of pins. This problem, however, is solved by the new control system according to the present invention.

The control method relying on the micro program has the following advantages:

1. Since centralization of control logic is possible, the arrangement of a control circuit is simplified.

2. The alteration and addition of functions are easy.

3. It is possible to effect parallel designs.

The method is therefore most suitable for the microcomputer which does not have a very high speed and which can be put into LSI form with the read only memory included.

The construction and operation of the control unit and the register unit will now be explained more in detail.

Figure 2:
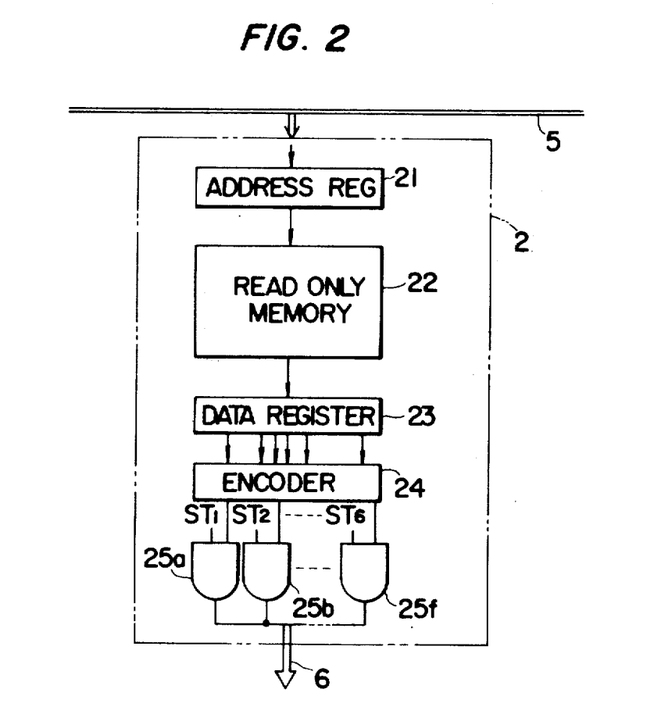
FIG. 2 is a block diagram showing the construction of a control unit in the micro-computer of the present invention.

Referring to FIG. 2 which shows the construction of the control unit, a micro instruction at an address designated by an address register 21 is read out from a read only memory 22 and is stored in a data register 23. The contents of the address register 21 are determined in accordance with the address part of a control word read out to the data register 23 and the contents of a control instruction register (not shown), a subroutine address register (not shown) etc.; the details thereof which will be readily familiar to those skilled in the art are omitted here for explanatory simplicity. The micro instruction of one word fetched from the read only memory 22 consists of thirty bits, which are divided into six stages by an encoder 24. The instruction parts divided into these stages are fed time-multiplexed onto the control bus 6 through gates 25a-25f which are sequentially opened and closed by stage timing pulses $ST_1$-$ST_6$, shown in FIG. 6. That is, the micro instruction of one word is divided into the six stages each consisting of five bits, and control of the register unit 1 is carried out with a stage as its fundamental unit. With this measure, a control signal to be transmitted from the control unit 2 to the register unit 1 is composed of five bits, so that, at most, several pins suffice for the control signal delivery and reception by each of the units 1 and 2.

Figure 3:
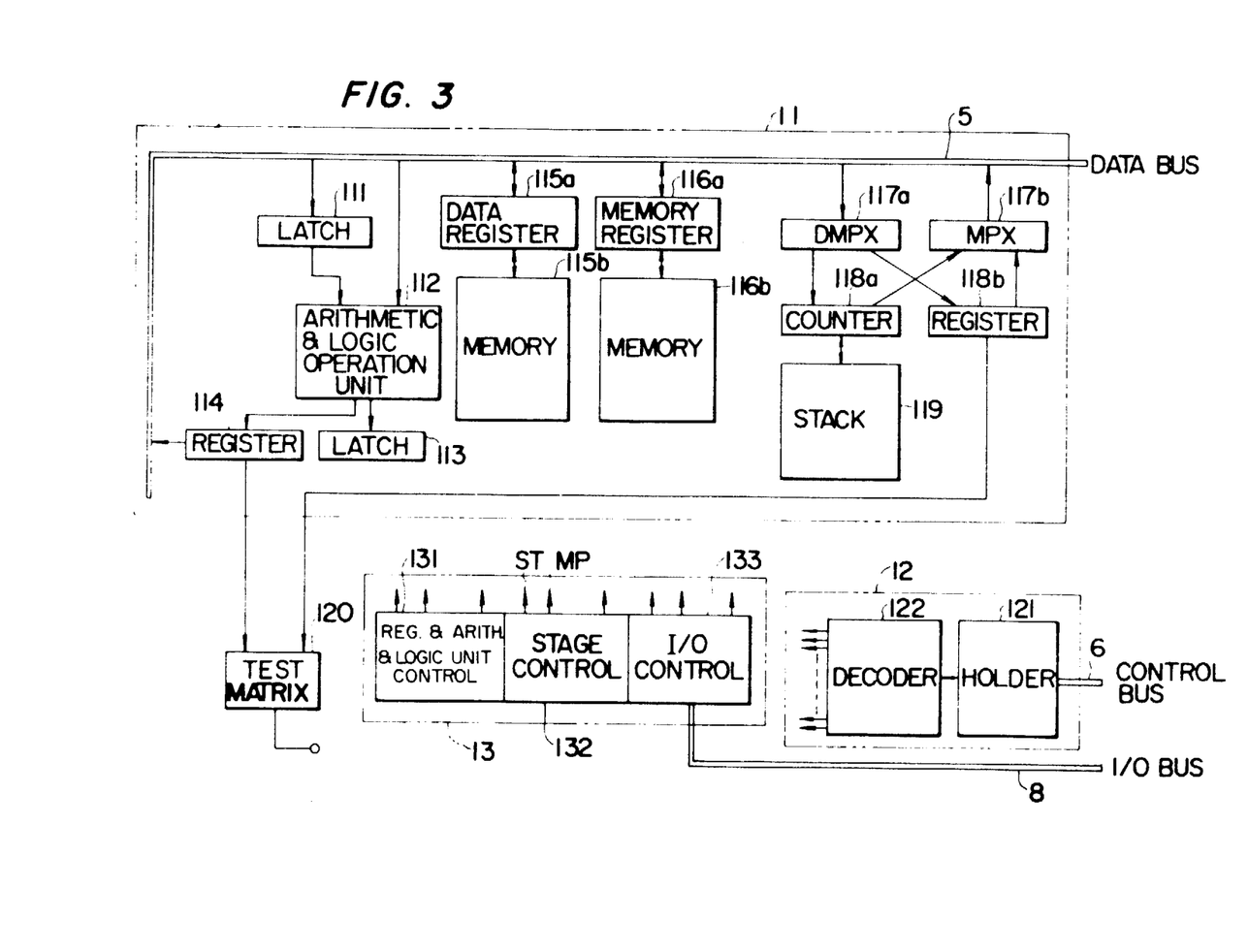
FIG. 3 is a block diagram showing the construction of an operation unit (register unit) in the micro-computer of the present invention.

As is shown in FIG. 3, the register unit 1 is constructed of a first part 11 which executes various operations designated by the micro instructions, a second part 12 which decodes the micro instruction in the stage unit as transmitted from the control unit 2, and a third part 13 which controls the timing of the register unit 1 and so forth.

Figure 4:
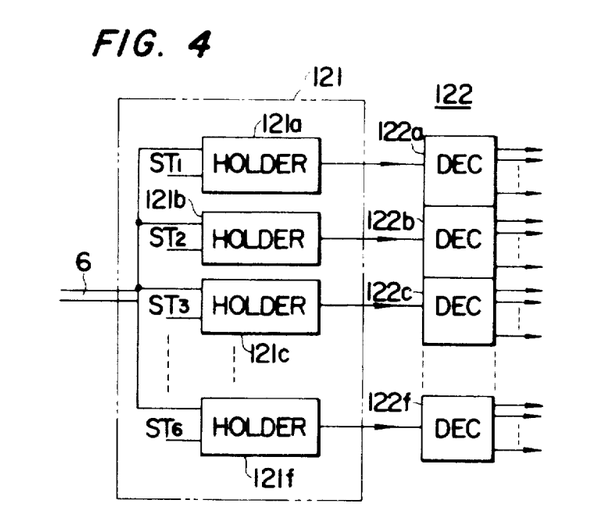
FIGS. 4 and 5 are constructional diagrams of a holder and a decoder of the unit in FIG. 3, respectively.

As is illustrated in FIG. 4, the second part 12 includes a holder or holding unit 121 and a decoder unit 122. The five-bit stage information transmitted to the register unit 1 is delivered to holders 121a-121f corresponding to the respective stages in synchronism with the stage timings $ST_1$-$ST_6$, and are stored there.

The reason for the necessity for the hold circuits 121a-121f is that, since the control information is transmitted in the stage unit in a time-sharing manner, it must be reserved at least for a required period in order to conduct the operation control with a plurality of stages overlapped, as will be explained later.

The roles of control are fixed for the respective stages. The instruction parts are decoded by the respectively corresponding decoder circuits 122a-122f, and predetermined controls are effected.

Figure 5:
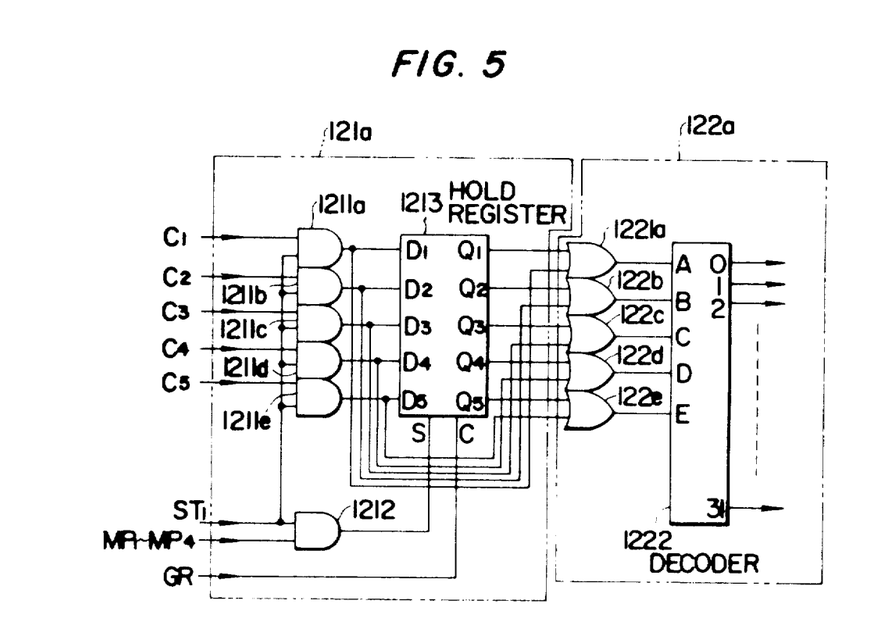

FIG. 5 shows a concrete arrangement of the circuits, for example, 121a and 122a, in the holding unit 121 and the decoder unit 122. The other holders 121b-121f and decoders 122b-122f have the same construction as in FIG. 5.

In the figure, control signals of five bits $C_1$-$C_5$ are entered through a control bus into the inputs of five AND gates 1211a-1211e on one side, while the stage timing pulse $ST_1$ is commonly applied to the inputs of the respective gates on the other side. At the outputs of the AND gates 1211a-1211e, accordingly, the control signals appear only in a period in which the pulse $ST_1$ is 1.

Figure 6:
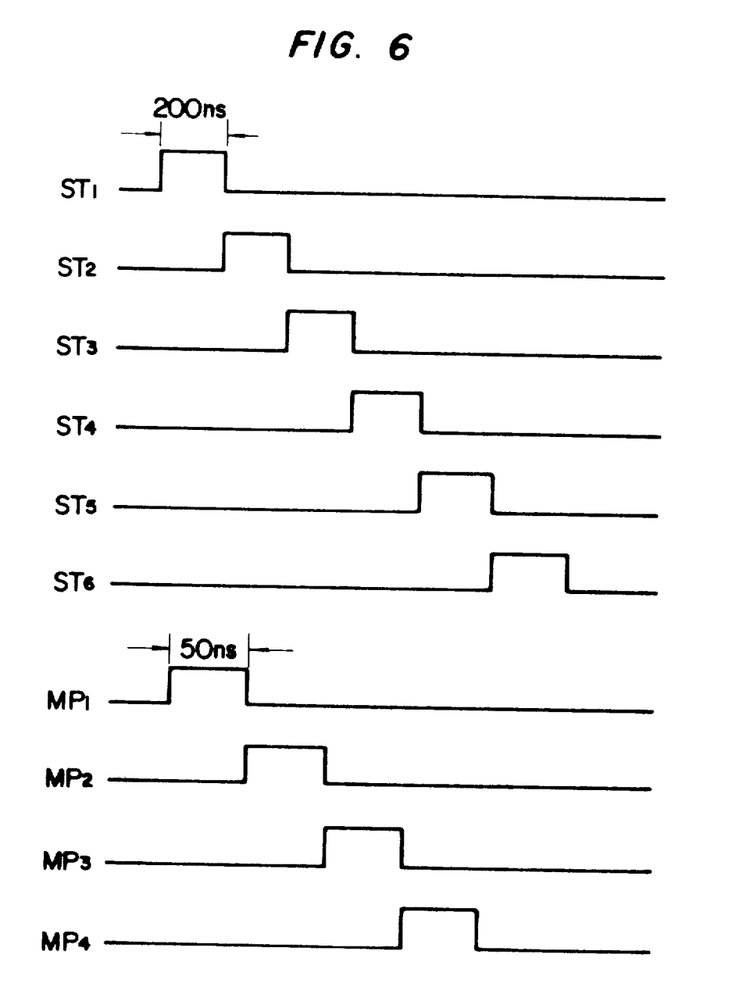
FIG. 6 is a timing chart which is used for explaining the operation of the present invention.

The control signals are applied to the D input terminal of a hold register 1213, and are set in the hold register by the AND outputs between the stage timing $ST_1$ and micro timings $MP_1$-$MP_4$ which are effected by further dividing it into four parts. The relationship between the timing pulses ST and MP is as shown in FIG. 6. GR indicates a signal which is applied from the external in order to reset the computer system. The outputs of the AND gates 1211a-1211e and the output of the hold register 1213 have logical sums taken therebetween by OR gates 1221a-1221e. With such a construction, the shortening of the effective stage period attributable to the setting lag of the hold register 1213 is prevented. The outputs of the OR gates 1221a–1221e are decoded by a decoder circuit 1222, to produce thirty-two control signals. By providing such circuits 121a and 122a in correspondence with the respective stages, the stage control signals sent from the control unit 2 can provide effective information for the first part 11 of the register unit 1 from the time of reception to the time at which the hold register 1213 is rewritten by the next micro instruction. The method of controlling the first part 11 by the outputs of the decoders 122a–122f will be described in detail later.

The first part 11 of the register unit shown in FIG. 3 has an input latch circuit 111 for temporarily storing operands, an arithmetic and logic operation unit 112, an output latch circuit 113 for temporarily storing the result of an operation, and a stage display register 114 for displaying the operation result, etc. Further, it comprises a general purpose register memory 115b which is made of a random access memory and which is used for executing operations in conformity with a program, a data register 115a which stores data from the register 115b and data to be supplied thereto, a register memory 116b of the random access memory construction which is used as the job area of the micro program, and a data register 116a which stores data fetched from the register memory 116b and data to be supplied thereto. The data register 116a serves also as a data register for the main memory 3 connected to the data bus 5. Further included in the first part 11 are a demultiplexer 117a and a multiplexer 117b, which couple a program counter 118a and an instruction register and memory address register 118b with the bus 5, respectively. The reason why the demultiplexer 117a and the multiplexer 117b are required is as follows.

The internal data of the micro-computer consists of eight bits and, accordingly, eight lines in correspondence with the eight bits, whereas the program counter 118a and the address register 118b have a length of sixteen bits, so that they can directly reach the main memory 3 of 65 K bits at a maximun. The exchanges of information between the respective registers 118a and 118b and the data bus 5 must, therefore, be carried out separately for the upper digit bits and the lower digit bits. Numeral 119 designates an address stack, which is a register file for storing a back address at a subroutine call.

The third part 13 of the register unit 1 has a control circuit 131 for controlling the various bus registers in the first part 11 and the arithmetic and logic operation unit 112, a unit 132 for controlling the timing of the register unit 1, and a unit 133 for controlling various I/O interfaces when input and output instructions are executed. The functions of the elements constituting the respective parts will become more apparent from the following description of the operation.

The micro instructions for use in the present embodiment are classified into four types on the basis of the control function. For the convenience of the explanation, the types are termed the type A, type M, type I/O and type T.

The type A includes instructions which mainly execute controls on the arithmetic and logic operation unit of the register unit 1, The type M includes instructions which execute the controls of the main memory 3. The type I/O includes instructions which execute the controls of the input output unit 4. The type T includes instructions which test operated results and control the branch of a micro program.

Figure 7A:
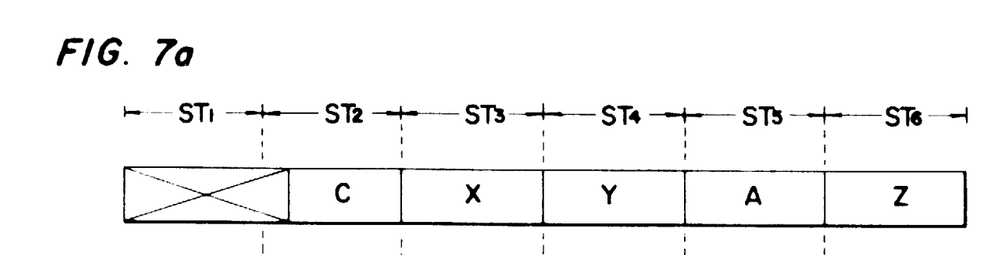
FIGS. 7a, 7b and 7c are diagrams showing the types of a micro-instruction.
Figure 7B:
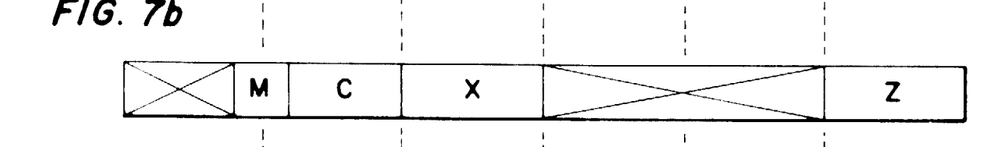
Figure 7C:
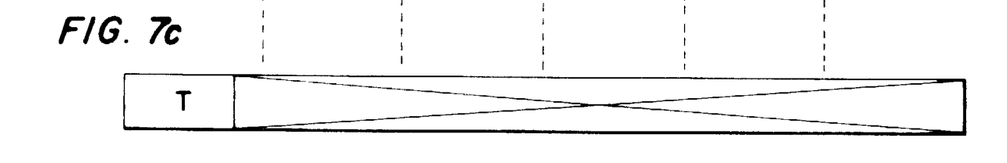

The micro instruction of one word of thirty bits as read out from the read only memory 22 is reformed into micro instructions shown in FIGS. 7a–7c, and every five bits are transmitted to the register unit 1 in synchronism with the stage timings $ST_1$–$ST_6$.

The stage timings $ST_1$–$ST_6$ have the following functions assigned beforehand, and the respective micro instruction feed signals at timings corresponding to the necessary functions.

$ST_1$ . . . designation of test condition, designation of memory referal.

$ST_2$ . . . designation of control condition, designation of I/O.

$St_3$ . . . designation of first source register.

$ST_4$ . . . designation of second source register.

$ST_5$ . . . designation of arithmetic and logic operation.

$ST_6$ . . . designation of destination register.

It is very effective for the simplification of the control circuit to previously determine the control functions of the signals at the respective stage timings in this manner. The reason is that since all the micro instructions are represented as the combinations of some of the functions in $ST_1$–$ST_6$, hardware for control corresponding to the respective functions may be prepared for commonly using for all the micro instructions.

As is illustrated in FIG. 7a, the micro instructions of the type A have the control functions of performing operation processings, for example, addition and subtraction, logical operation shifts, designated by an A field as to the contents of two source registers designated by X and Y fields, and storing the result into a register designated by a Z field. Moreover, where, for example, the renewal of the contents of the program counter 118a is designated by a C field, it is performed as a special control.

Figure 8A:
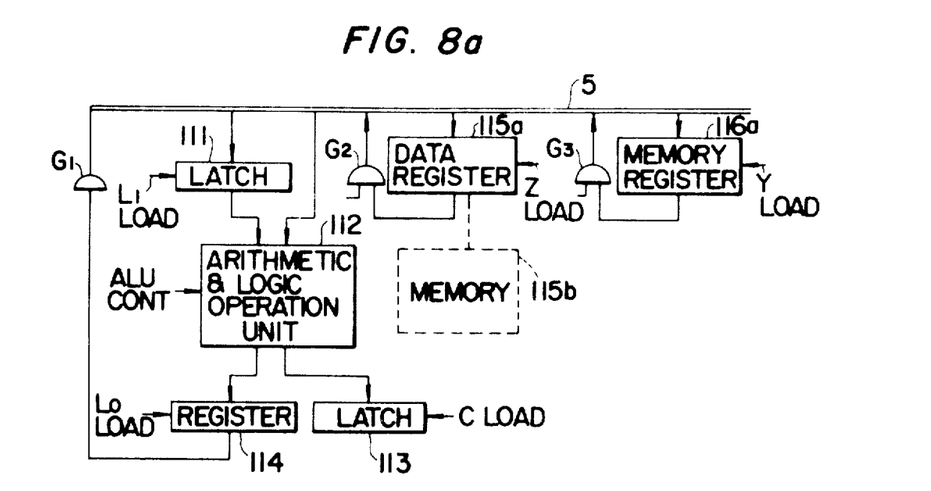
FIGS. 8a, and 8b, 9a and 9b, 10a and 10b, and 11a and 11b are diagrams for explaining the aspects of operation control by the micro computer of the present invention.
Figure 8B:
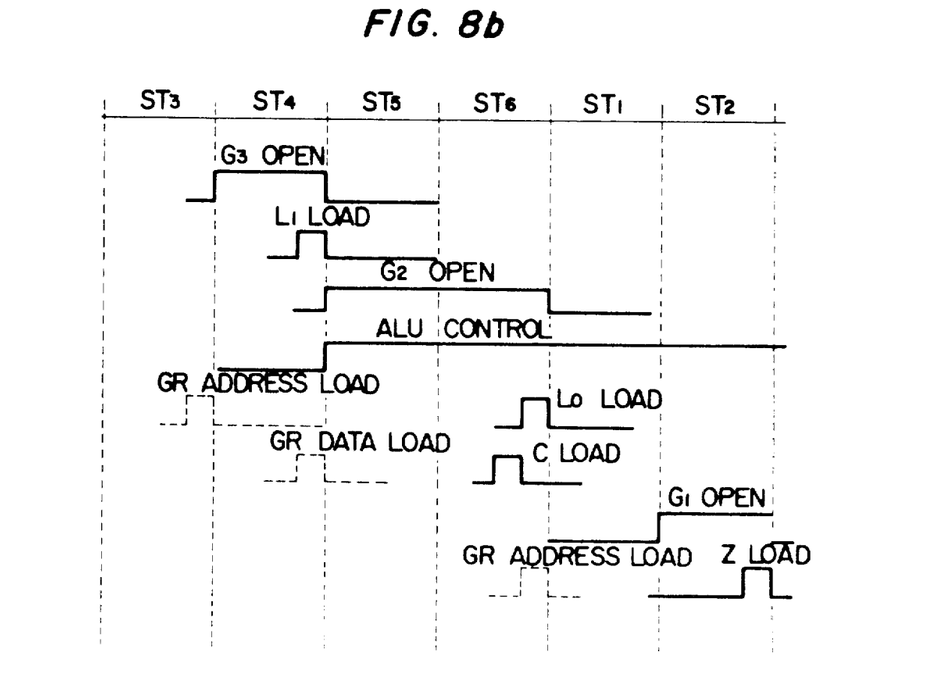

The fundamental sequence of the controls by the micro instructions of the type A will now be explained with reference to FIGS. 8a and 8b.

a. When the first source register appointed by the X field is the general-purpose register memory 115b, the contents of the memory 115b are read out between the stages $ST_3$ and $ST_4$, and they are set in the data register 115a. Thereafter, the data register 115a is regarded as the first source register (X).

b. In the period ($ST_3$, $ST_4$) for reading out the contents of the register memory 115b, the data bus 5 is idle, By utilizing the idle time, the contents of the data register 116a designated as the second source register (Y) by the Y field are set in the input latch circuit 111.

c. Between the stages $ST_5$ and $ST_6$ a gate $G_2$ is opened, to feed as the input of the arithmetic and logic operation unit 112 the contents of the data register 115a designated as the first source register (X).

d. Since the control signal designating the operation processing (which operation is to be performed) is given to the operation unit 112 after the stage $ST_5$, the specified operation processing is executed between $ST_5$ and $ST_6$. The result is set in the output latch circuit 113.

e. The states of the sign or zero, carry and overflow for the operation result are set in the state register 114.

f. At the stage $ST_2$ of the next machine cycle, a gate $G_1$ is opened, and the operation result is transmitted to the data bus 5. It is set in the data register 115a designated as the destination register by the Z field. Where the general-purpose register memory 115b is designated as the destination register, the address is set at the stage $ST_6$, and a write starting signal is applied.

As is apparent from the above explanation, in the time slot of, for example, $ST_4$, there are conducted in parallel the control by which the data stored in the data register 116a is set in the input latch circuit 111 and the control by which the necessary data is read out from the general purpose register memory 115b and is set in the data register 115a. In the other times, the control of the processing using the data bus 11 and the control of the processing not using the bus 11 are likewise conducted in parallel. By thus performing the micro instructions divided into six stages in parallel in point of time, the processing time can be remarkably shortened.

In cases of the M type micro instructions controlling the main memory 3 and the I/O type micro instructions controlling the input output control unit 4, signals are respectively transmitted in the M field, C field, X field and Z field corresponding to the times of $St_1$, $ST_2$, $St_3$ and $ST_6$ as illustrated in FIG. 7b. The type M and the type I/O are distinguished by two bits of the M field.

Figure 9A:
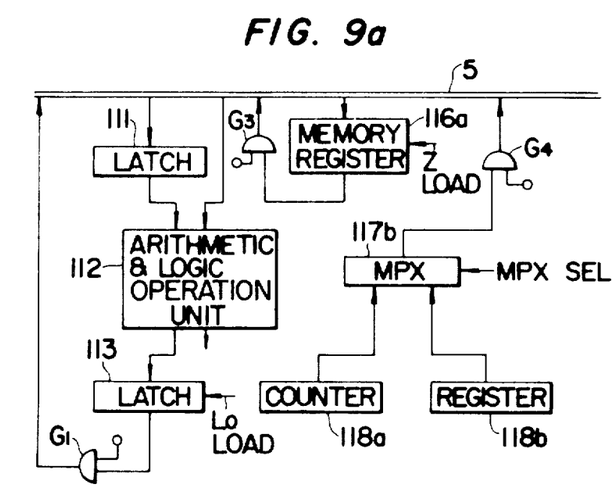
Figure 9B:
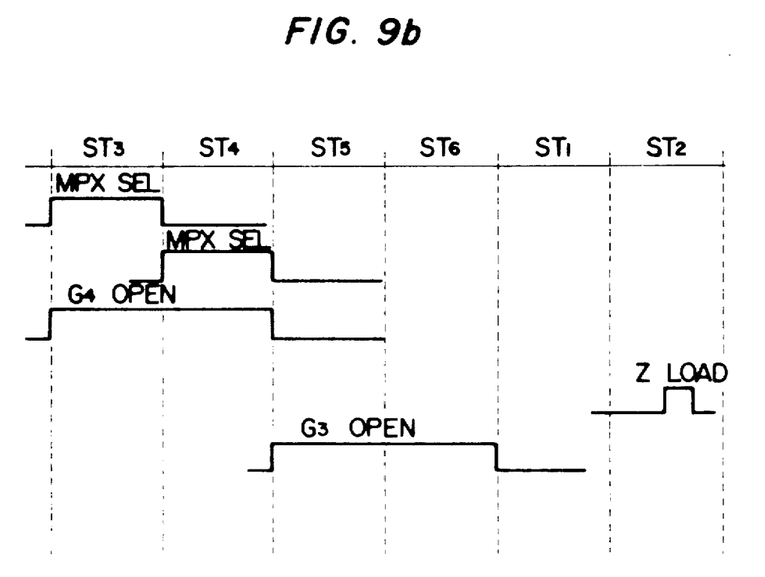

The control sequence by the micro instructions of the type M will now be explained with reference to FIGS. 9a and 9b.

At the lower digit bit of the M field fed at the stage timing $ST_2$, there is the designation whether the program counter 118a or the effective address register 118b is selected as the register which contains address information to be transmitted to the main memory. The multiplexer 117b transmits to the data bus 5 the address information of the counter 118a or the register 118b appointed by the control signal made of the signal of the M field. Herein, since the data bus is of the eight-bit construction whereas the address of the main memory 3 is of sixteen bits, every eight bits are dividedly transmitted twice. In actuality, the selecting control signal of the multiplexer 117b is so made as to transmit the eight upper digit bits of the address information in the period $ST_3$ and to transmit the eight lower digit bits in the period $ST_4$. On the side of the main memory 3, the address information fed in the periods $ST_3$ and $ST_4$ is set in a memory address register (not shown).

In case of writing a data into the main memory 3, the source register is designated by the X field of the micro instruction. For example, where the data register 116a is designated as the source register, the contents of the register are transmitted to the data bus 5 through a gate $G_3$ which is opened in the periods $ST_5$ and $ST_6$. On the main memory side, the data is delivered to a data register (not shown) in the latter half of $ST_5$.

Where data is read out from the main memory 3, address information is fed also in the times $ST_3$ and $ST_4$, and the system automatically falls into a wait mode in the time $ST_5$. The main memory 3 transmits read data to the data bus 5 and simultaneously feeds a data bus enable signal, so that the wait mode is released by this signal. The data transmitted to the data bus 5 is stored into the destination register designated by the Z field of the micro command. For example, where the data register 116a is designated as the destination register, a Z-load signal enters the register 116a in the time $ST_2$ as in the command of the type A, and data on the bus 5 is stored.

Figure 10A:
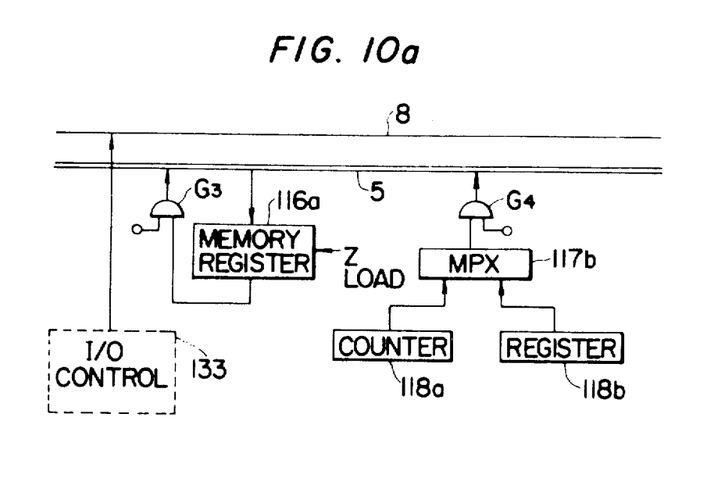
Figure 10B:
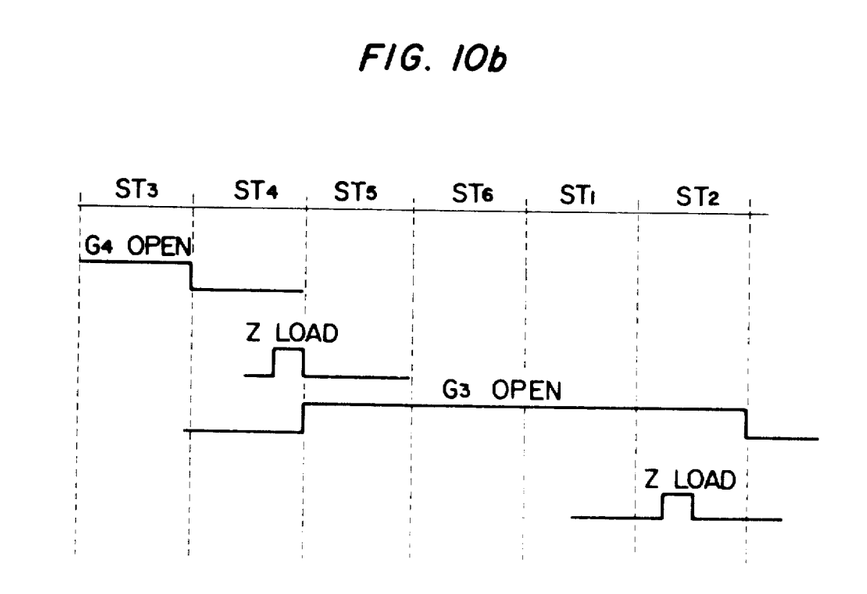
Figure 11A:
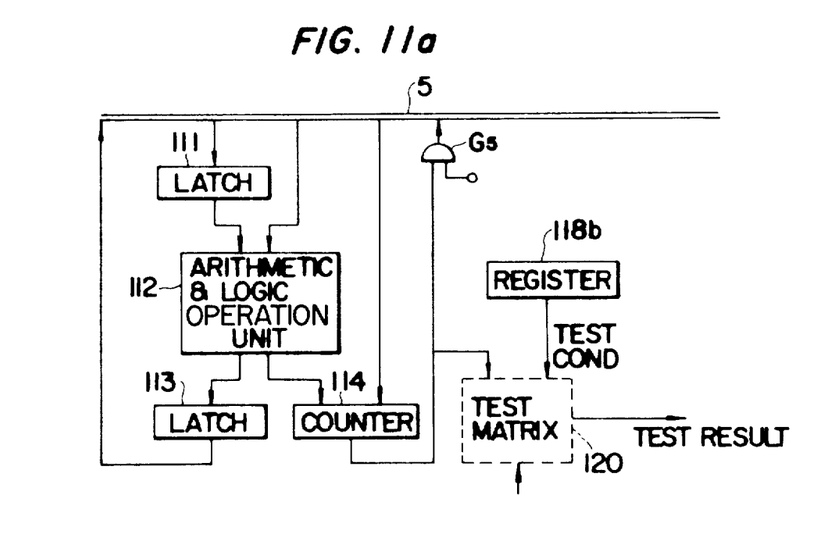
Figure 11B:
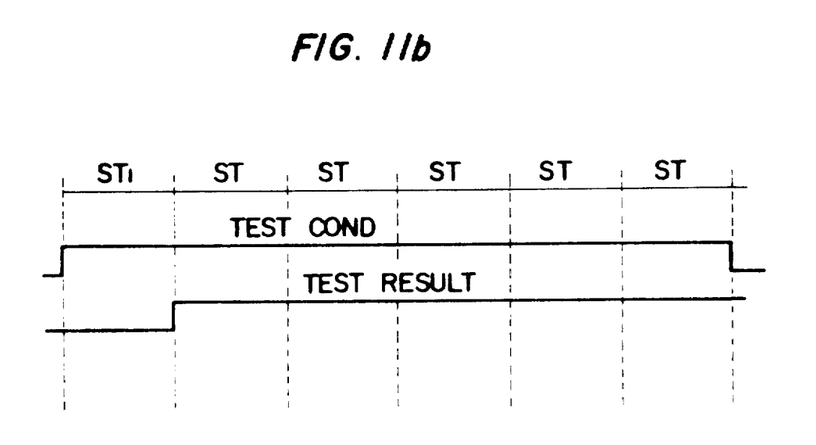

Referring now to FIGS. 10a and 10b, description will be made of the control sequence by the micro commands of the type I/O. With this type of instruction, the address of an input and output device is designated by the C field. Since information designating the address of the device is written in the address column of an input and output instruction, the multiplexer 117b is so controlled as to transmit the lower digit bit of the instruction register 118b to the data bus 5. Thereafter, the gate $G_3$ is opened, and the contents of the data register 116a designated as the source register X are transmitted.

Where data is supplied from the input output control unit 4, information designating the input and output device is transmitted also in the time $ST_3$, and the system falls into the wait mode. The input and output device transmits the data to the data bus and simultaneously feeds the data bus enable signal, so that the wait mode is released by this signal. The data is stored in the destination register appointed by the Z field, for example, the data register 116a.

The register unit 1 includes therein a circuit 133 which generates input and output signals necessary for executing input and output instructions and by which various data are fed to the input output control unit 4. The flow of the input and output data has no essential difference from the case of controlling the main memory 3. However, the input output control unit 4 does not have the stage timings synchronized with the processor as in the main memory 3, so that confirmation by an answer back signal is necessary at every exchange of information. For this reason, the input output unit 4 always falls into the waiting mode and awaits the answer back signal at all the stages except $ST_6$ and $ST_1$.

The micro instructions of the type T serve to test the state information for an operated result, and are transmitted in the T field corresponding to the time of $ST_1$ as illustrated in FIG. 7c. As the register into which the state information is placed, the register 114 is prepared, in which are displayed the sign or zero, carry and overflow for the contents of an accumulator (not shown) containing the operated result. One bit of the register 114 is assigned to an interrupt inhibit flag, and the test is possible.

The T type micro instruction can appoint the next test condition by the four bits of the T field.

| | | | |
|---|---|---|---|
| (a) | 0001 | zero | ⎫ |
| (b) | 0010 | sign | ⎬ as to contents |
| (c) | 0011 | carry | ⎬ of accumulator |
| (d) | 0100 | overflow | ⎭ |
| (e) | 0101 | interrupt inhibit flag | |
| (f) | 0110 | contents indicated by lower bit of instruction register 118b | |
| (g) | 0111 | zero of shift counter | |

The register unit 1 is provided with a test matrix circuit 120 in order to test state information. The test condition are designated by the T field of the micro instruction and by the lower bit of the instruction register 118b. On the other hand, the state information to be tested is supplied from the register 114 to the matrix circuit 120. A test result for the designated test condition is sent back to the control unit 2 as an output. On the basis of the test result fed, the control unit 2 determines the address of the micro instruction to be subsequently executed.

The forms and the control functions of the various types of micro instructions explained above, can be summarized as in Table 1.

Table 1

Types and Control Functions of Micro Commands

| TYPE | | ST₁ | | | ST₂ | ST₃ | ST₄ | ST₅ | ST₆ |
|---|---|---|---|---|---|---|---|---|---|
| A | | φ | 0 | 0 | CCCC | XXXXX | YYYYY | AAAAA | ZZZZZ |
| M | MM READ | 0000 | 1 | 0 | CCCC | φ | φ | φ | ZZZZZ |
| | MM WRITE | 0000 | 1 | 0 | CCCC | XXXXX | φ | φ | φ |
| | I/O READ | φ | 0 | 1 | φ | φ | φ | φ | ZZZZZ |
| | I/O WRITE | φ | 0 | 1 | φ | XXXXX | φ | φ | φ |
| T | | TTTT | 0 | 0 | φ | φ | φ | φ | φ |
| FUNCTION | | Test of condition (TTTT). Designation of memory refer. | | | Designation of control condition (CCCC). Designation of I/O. Designation of address source. | Designation of source register (XXXXX). | Designation of source register (YYYYY). | Designation of ALU function (AAAAA). | Designation of destination register (ZZZZZ). |

As explained above, according to the present invention, the micro instruction is divided into six stages, the functions for control are assigned to the respective stage units, the control signal from the control unit to the register unit is transmitted in the stage units in the time-share, and the overlap processing among the stages is possible within the register unit. Therefore, the following advantages are achieved.

1. Since the uni-bus system is adopted, the wiring area can be reduced.

2. Since the micro instruction to be transmitted from the control unit to the register unit is fed in the stage unit in time-multiplexed format, the number of the necessary pins of both the units may be small. Consequently, the problem of "pin-necks" in the large scale integration can be solved.

3. In executing the micro instructions divided into the stage units, controls corresponding to a plurality of instructions can be made in a manner to overlap in time, so that an operation control of comparatively high speed is possible.

We claim:

1. A micro-computer having a control unit and an operation unit, said control unit comprising:
a read only memory for storing a plurality of micro instructions,
first means, coupled to said read only memory, dividing a micro instruction read out therefrom into a plurality of stages, each of which corresponds to a fundamental unit for controlling said operation unit, and
second means, coupled to said first means, for transmitting the micro instructions divided into respective stages to said operation unit in a time-shared format;

said operation unit comprising:
third means, coupled to said second means, for storing micro instructions transmitted from said control unit according to the fundamental units into which the instructions are divided;
fourth means, coupled to said third means, for decoding the stored micro instructions, and
fifth means, coupled to said fourth means, for effecting the execution of the decoded micro instructions in a manner to partially overlap in time.

2. A micro-computer according to claim 1, wherein said control unit and said operation unit are connected to a data bus.

3. A micro-computer according to claim 2, further comprising an input-output control unit and a main memory coupled to said data bus.

4. A micro-computer according to claim 1, wherein said first means comprises means for encoding a micro-instruction read out from said read only memory into a plurality of fields corresponding to said stages, said field including a first field designating a test condition of said operation unit, a second field designating a control condition, a third field designating a first source register, a fourth field designating a second source register, a fifth designating an arithmetic and logic operation of said operation unit, and a sixth field designating a destination register, said operation unit being controlled according to the instructions contained in said fields.

5. A micro-computer according to claim 2, wherein said fifth means of said operation unit comprises
an input latch circuit, coupled to said data bus, for temporarily storing operands supplied thereover,
an arithmetic and logic operation unit coupled to said input latch circuit and said data bus,
an output latch circuit, coupled to said arithmetic and logic operation unit, for temporarily storing the result of the operation thereof, and
a state display register, coupled to said arithmetic and logic operation unit, for displaying said operation result.

6. A micro-computer according to claim 5, wherein said fifth means of said operation unit comprises
a demultiplexer coupled to received data from said data bus,
a program counter, coupled to receive the output of said demultiplexer,
a register file, coupled to said program counter, for storing a back address for a subroutine request,
an address register coupled to the output of said demultiplexer and
a multiplexer coupling the contents of said program counter and said address register to said data bus.

7. A micro-computer according to claim 6, wherein said first means comprises means for encoding a micro-instruction read out from said read only memory into a plurality of fields corresponding to said stages, said field including a first field designating a test condition of said operation unit, a second field designating a control condition, a third field designating a first source register, a fourth field designating a second source register, a fifth field designating an arithmetic and logic operation of said operation unit, and a sixth field designating a destination register, said operation unit being controlled according to the instructions contained in said fields.

8. A micro-computer according to claim 7, wherein said fifth means of said operation unit comprises a test matrix circuit, coupled to said output latch circuit and to said address register, for testing state information in response to said first field and the contents of said address register, the output of said test matrix circuit being coupled to said control unit, so that said control unit determines the address of a micro instruction to be subsequently executed.

9. A micro-computer according to claim 1, wherein said control unit is formed as one LSI chip and said operation unit is formed as another LSI chip.

10. A micro-computer according to claim 8, wherein said control unit is formed as one LSI chip and said operation unit is formed as another LSI chip.

* * * * *